United States Patent
Neumann

(10) Patent No.: US 7,123,074 B2
(45) Date of Patent: Oct. 17, 2006

(54) METHOD AND SYSTEM FOR MULTICHANNEL-ISOLATION-TECHNIQUE MULTIPLEXER

(75) Inventor: Bernd Neumann, Muellrose (DE)

(73) Assignee: Micrel, Inc., San Jose, CA (US)

( * ) Notice: Subject to any disclaimer, the term of this patent is extended or adjusted under 35 U.S.C. 154(b) by 0 days.

(21) Appl. No.: 10/785,276

(22) Filed: Feb. 24, 2004

(65) Prior Publication Data

US 2005/0184791 A1 Aug. 25, 2005

(51) Int. Cl.
*H03K 17/62* (2006.01)

(52) U.S. Cl. .................................... 327/407; 327/99

(58) Field of Classification Search ........ 327/407–411, 327/99
See application file for complete search history.

(56) References Cited

U.S. PATENT DOCUMENTS

| | | | | |
|---|---|---|---|---|
| 5,196,733 A | * | 3/1993 | Shin | 327/379 |
| 6,211,721 B1 | * | 4/2001 | Smetana | 327/407 |
| 6,218,887 B1 | * | 4/2001 | Brown | 327/408 |
| 6,310,509 B1 | * | 10/2001 | Davenport et al. | 327/407 |
| 6,515,518 B1 | * | 2/2003 | Minegishi | 327/65 |
| 6,531,910 B1 | * | 3/2003 | Krawczyk et al. | 327/407 |
| 6,566,912 B1 | * | 5/2003 | Smetana | 327/12 |
| 6,636,077 B1 | * | 10/2003 | Chang et al. | 326/105 |

* cited by examiner

*Primary Examiner*—Kenneth B. Wells
(74) *Attorney, Agent, or Firm*—Sawyer Law Group LLP

(57) ABSTRACT

A multiplexer is disclosed. The multiplexer comprises a first input and a first channel coupled to the first input. The multiplexer further includes a second input and a second channel coupled to the second input. Finally, the multiplexer includes an output coupled to the first and second channels, wherein a coupling capacitance of an inactive one of the first and second channels is not coupled directly to the output. A method and system in accordance with the present invention reduces crosstalk and jitter in a multiplexer by eliminating the coupling capacitance between an inactive input and the output. In so doing, there is significantly better isolation between channels thereby minimizing the aforementioned cross-talk and jitter.

13 Claims, 2 Drawing Sheets

METHOD AND SYSTEM FOR MULTICHANNEL-ISOLATION-TECHNIQUE MULTIPLEXER

FIELD OF THE INVENTION

The present invention relates generally to multiplexers and more particularly to a method and system for reducing cross-talk and jitter in such multiplexers.

BACKGROUND OF THE INVENTION

In conventional multiplexers the output voltage of the active output is influenced by the non-active input if both inputs have similar phase conditions. The reason for this behavior is the coupling capacitance Ccb of the non-active input to the active output. This results in a non-optimal isolation of the active and the non-active channel with higher crosstalk and higher jitter.

FIG. 1 is a diagram of a conventional multiplexer 10. The conventional multiplexer includes first and second differential amplifiers 12 and 14. As is seen, differential amplifier 12 comprises transistors 16a and 16b, and differential amplifier 14 comprises transistors 18a and 18b. The conventional multiplexer 10 has its non-inverted Select input set to high and its inverted Select input set to low. The active channel is input IN1 with the transistors 16a, 16b, 20a and 20b. Accordingly, there is a high coupling capacitance between the non-active input IN2 and the active output. Therefore it is desirable to provide better isolation between active and inactive channels and thereby reduce crosstalk and jitter.

Accordingly, what is needed is a system and method for overcoming the above-identified problem. The present invention addresses such a need.

SUMMARY OF THE INVENTION

A multiplexer is disclosed. The multiplexer comprises a first input and a first channel coupled to the first input. The multiplexer further includes a second input and a second channel coupled to the second input. Finally, the multiplexer includes an output coupled to the first and second channels, wherein a coupling capacitance of an inactive one of the first and second channels is not coupled directly to the output.

A method and system in accordance with the present invention reduces crosstalk and jitter in a multiplexer by eliminating the coupling capacitance between an inactive input and the output. In so doing, there is significantly better isolation between channels thereby minimizing the aforementioned cross-talk and jitter.

DETAILED DESCRIPTION

The present invention relates generally to multiplexers and more particularly to a method and system for reducing cross-talk and jitter in such multiplexers. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A method and system in accordance with the present invention reduces crosstalk and jitter in a multiplexer by eliminating the coupling capacitance between an inactive input and the output. In so doing, there is significantly better isolation between channels thereby minimizing the aforementioned cross-talk and jitter.

In a preferred embodiment, the coupling capacitance is moved one level down from the output level. Hence, there is no direct coupling between an active input and a non-active input to the output. This modification in the present multiplexer reduces the crosstalk and jitter significantly. To describe these features in more detail, please refer now to the following description in conjunction with the accompanying figure.

Figure 1:
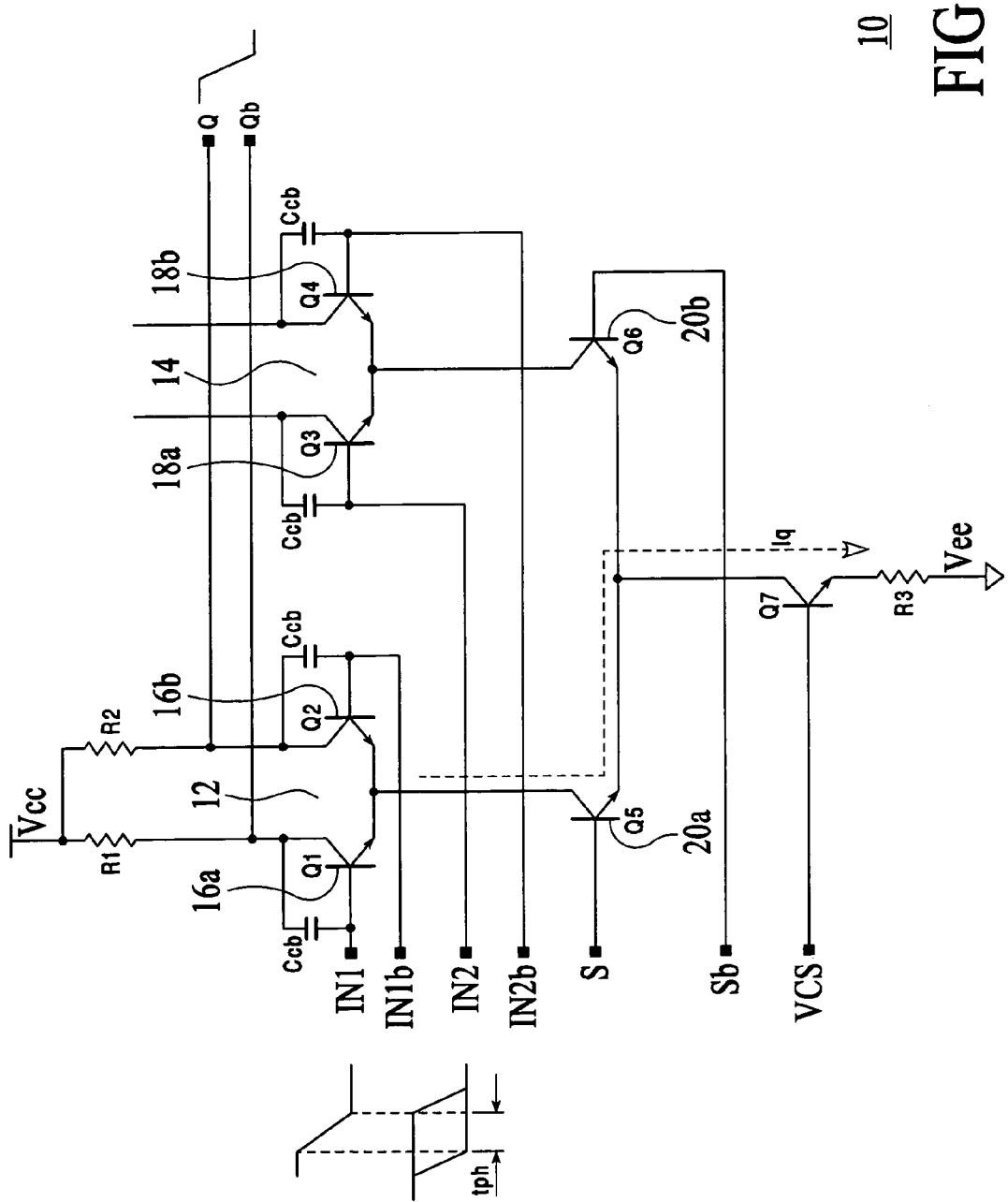
FIG. 1 is a diagram of a conventional multiplexer.
Figure 2:
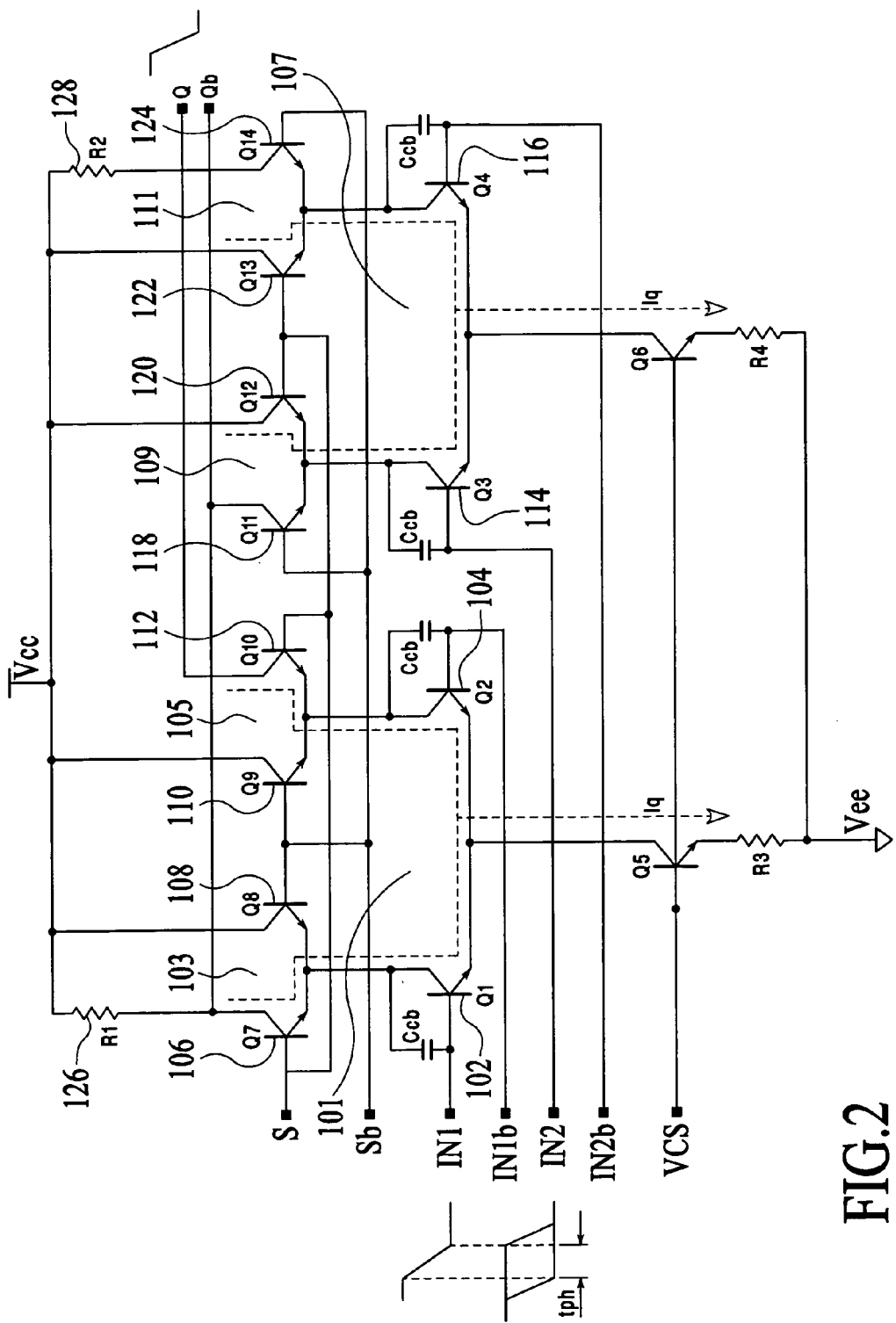
FIG. 2 is a diagram of a multiplexer in accordance with the present invention.

FIG. 2 is a diagram of a multiplexer 100 in accordance with the present invention. Please find below a glossary of terms related to FIG. 2.

Glossary of Terms
  S non-inverted Select input
  Sb invertedSelect input
  IN1 non-inverted Data input 1
  IN1b inverted Data input 1
  IN2 non-inverted Data input 2
  IN2b inverted Data input 2
  Q non-inverted Output
  Qb inverted Output
  Ccb Collector base capacitance
  tph Phase relation between input 1 and input 2

Operation

It is assumed the active input is IN1 with the corresponding differential amplifier 101 which comprises transistors 102 and 104. The collectors of transistors 102 and 104 are coupled to differential amplifier 103, which comprises transistors 106 and 108, and a differential amplifier 105, which comprises transistors 110 and 112.

The non-active input IN2 is coupled to differential amplifier 107, which comprises transistors 114 and 116. The collectors of transistors 114 and 116 are coupled to differential amplifier 109, comprising transistors 118 and 120, and differential amplifier 111, which comprises transistor 122 and 124. The collectors of transistors 108, 110, 120 and 122 are coupled to VCC. The collectors of transistors 106 and 118 are coupled together to resistor 126 and form the inverted output Qb. The collectors of transistors 112 and 124 are coupled together to resistor 128 and form the non-inverted output Q.

Consider now the case when the non-inverted Select input is high and the inverted Select input is low. Therefore, transistors 106, 112, 120 and 122 are on and transistors 108, 110, 118 and 124 are off. The input IN1 is passed to the output since IN2 has no impact because the collectors of transistors 120 and 122 are coupled to VCC.

Consider the case when the inverted Select input is high and the non-inverted Select input is low. Therefore, transistors 108, 110, 118 and 124 are on and 106, 112, 120 and 122 are off. The input IN2 is passed to the output since IN1 has no impact because the collectors of transistors 108 and 110 are coupled to VCC. It is assumed that there is a constant low impedance DC level of the inverted and non-inverted Select input. Accordingly, there is a minimum impact of the non-active channel on the active channel since the coupling capacitance of the non-active channel is not coupled directly to the output.

A method and system in accordance with the present invention reduces crosstalk and jitter in a multiplexer by eliminating the coupling capacitance between an inactive input and the output. In so doing, there is significantly better isolation between channels thereby minimizing the aforementioned cross-talk and jitter.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multiplexer comprising:
   a first input;
   a first differential amplifier of a first channel, the first differential amplifier including a first differential pair of transistors coupled to the first input;
   a second input;
   a second differential amplifier of a second channel, the second differential amplifier including a second differential pair of transistors coupled to the second input;
   an output;
   a first plurality of selection transistors coupled between the first differential pair of transistors and the output; and
   a second plurality of selection transistors coupled between the second differential pair of transistors and the output,
   wherein the first channel is selected as active or inactive by the first plurality of selection transistors and the second channel is selected as active or inactive by the second plurality of selection transistors.

2. The multiplexer of claim 1 which includes a first select input for activating the first channel and inactivating the second channel and a second select input for inactivating the first channel and activating the second channel.

3. The multiplexer of claim 1 wherein when the first channel is inactive or when the first channel is active, a subset of the first plurality of selection transistors is turned off, and a subset of the first plurality of selection transistors is turned on.

4. The multiplexer of claim 1 wherein when the second channel is inactive or when the second channel is active, a subset of the second plurality of selection transistors is turned off, and a subset of the second plurality of selection transistors is turned on.

5. The multiplexer of claim 1 wherein when the first channel is selected to be active, the second channel is selected to be inactive, and when the second channel is selected to be active, the first channel is selected to be inactive.

6. The multiplexer of claim 1 which further includes a first select input for activating the first channel and inactivating the second channel using a first subset of the first plurality of selection transistors and a first subset of the second plurality of selection transistors, and a second select input for inactivating the first channel and activating the second channel using a second subset of the second plurality of selection transistors and a second subset of the first plurality of selection transistors.

7. The multiplexer of claim 2 wherein the first select input is inverted relative to the second select input.

8. A multiplexer comprising:
   a first input;
   a first channel including a first input differential amplifier coupled to the first input, and a first plurality of selection transistors coupled to the first input differential amplifier;
   a second input;
   a second channel including a second input differential amplifier coupled to the second input, and a second plurality of selection transistors coupled to the second input differential amplifier; and
   an output coupled to the first and second plurality of selection transistors, wherein selection inputs provided to the first and second plurality of selection transistors connect either the first channel or the second channel as active for output and the other one of the first channel or second channel as inactive for output, and wherein the selection inputs include a first select input for activating the first channel and inactivating the second channel, and a second select input for inactivating the first channel and activating the second channel,
   wherein a first subset of the first plurality of selection transistors is turned off and a second subset of the first plurality of selection transistors is turned on when the first channel is inactive, and wherein a first subset of the second plurality of selection transistors is turned off and a second subset of the second plurality of transistors is turned on when the second channel is inactive, wherein the first subset of the first plurality of selection transistors is directly coupled to the output, and wherein the second subset of the second plurality of selection transistors is not directly coupled to the output.

9. The multiplexer of claim 8 wherein the second subset of the second plurality of selection transistors is coupled to a positive voltage source.

10. The multiplexer of claim 8 wherein the first subset of the second plurality of selection transistors is directly coupled to the output, and wherein the second subset of the first plurality of selection transistors is not directly coupled to the output.

11. The multiplexer of claim 10 wherein the second subset of the first plurality of selection transistors is coupled to a positive voltage source.

12. The multiplexer of claim 8 wherein the selection inputs include a first selection input provided to particular ones of the first plurality of selection transistors and to particular ones of the second plurality of selection transistors, and a second selection input provided to other ones of the first plurality of selection transistors and other ones of the second plurality of selection transistors.

13. The multiplexer of claim 12 wherein the first selection input is inverted relative to the second selection input.

* * * * *